(12) United States Patent
Nakatani et al.

(10) Patent No.: US 6,441,692 B1
(45) Date of Patent: *Aug. 27, 2002

(54) PLL FREQUENCY SYNTHESIZER

(75) Inventors: Toshifumi Nakatani, Moriguchi; Hisashi Adachi, Mino; Hiroaki Kosugi, Hirakata; Yuji Saito, Yokohama; Shunsuke Hirano, Sagamihara; Hiroshi Haruki, Yokohama, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,740

(22) Filed: Sep. 17, 1998

(30) Foreign Application Priority Data

Sep. 17, 1997 (JP) .............................. 9-252420
Sep. 24, 1997 (JP) .............................. 9-259103

(51) Int. Cl.$^7$ .............................. H03B 21/00; H03B 1/00
(52) U.S. Cl. .............................. 331/42; 331/74; 331/76; 327/105; 327/156
(58) Field of Search .............................. 327/105, 156; 331/42, 37, 74, 76, 77, 38, 40, 41, 43, 16; 455/260, 265

(56) References Cited

U.S. PATENT DOCUMENTS 3,662,287 A * 5/1972 Egbert et al. ............ 331/117 R
5,568,098 A * 10/1996 Horie et al. ................. 331/16
6,094,158 A * 7/2000 Williams ...................... 342/70

FOREIGN PATENT DOCUMENTS

| DE | 2812158 | 9/1979 |
| EP | 0550516 | 8/1992 |
| EP | 0771076 | 5/1997 |
| JP | 01032532 | 2/1989 |
| JP | 05327493 | 12/1993 |
| JP | 07183804 | 7/1995 |
| JP | 08307262 | 11/1996 |

OTHER PUBLICATIONS

Wolaver, Dan H., Phase–Locked Loop CIrcuit. Design, 1991, p. 199.*
Crawford, James A., Frequency Synthesizer Design Handbbok, 1994, p. 288.*
JP 08307262 A, Nov. 22, 1996, abstracts XP002084564, Database WPI, Setion EI, week 9706, Derwent Publication Ltd., London, GB.

* cited by examiner

Primary Examiner—Benny Lee
Assistant Examiner—Kimberly E Glenn
(74) Attorney, Agent, or Firm—Smith, Gambrell & Russell, LLP

(57) ABSTRACT

The invention provides a high-speed PLL frequency synthesizer in which the frequency of a reference signal can be made larger than a frequency interval of an external output with a simple configuration. An n-th harmonic of an output of a voltage-controlled oscillator is caused to pass through a band pass filter. The frequency of an output of the band pass filter is divided by M in a variable frequency divider. The phase of an output of the variable frequency divider is compared with that of the reference signal in a phase comparator. An output of the phase comparator is smoothed by a loop filter. The output of the voltage-controlled oscillator is controlled by an output of the loop filter. The fundamental wave of the output of the voltage-controlled oscillator is caused to pass through another band pass filter, and then output to the outside. At this time, the frequency of the reference signal is n times a frequency interval of the fundamental wave of the output of the voltage-controlled oscillator.

16 Claims, 6 Drawing Sheets

PLL FREQUENCY SYNTHESIZER

BACKGROUND OF THE INVENTION

1. Field of the Invention

The invention relates to a PLL frequency synthesizer which is useful in a portable telephone or the like, and particularly to a PLL frequency synthesizer which can realize high frequency switching.

2. Description of the Prior Art

A PLL frequency synthesizer is a circuit which uses a feedback loop for synchronization in frequency and phase with a certain reference frequency signal and generates a signal of a target frequency by multiplying the reference frequency signal or by combining the reference frequency signal with another reference frequency signal.

In general, in a PLL frequency synthesizer, the fundamental wave of a voltage-controlled oscillator which is an external output is fed back, and hence the frequency interval of the external output coincides with the frequency of a reference signal. Herein, a frequency interval is, for example, an interval of a frequency between adjacent channels. FIG. 5 shows an example of a PLL frequency synthesizer of the prior art. In the figure, 501 designates a phase comparator, 502 designates a loop filter, 503 designates a voltage-controlled oscillator, and 504 designates a variable frequency divider. The phase comparator 501 compares the phase of a reference signal with that of an output of the variable frequency divider 504. The loop filter 502 smooths an output of the phase comparator 501. The voltage-controlled oscillator 503 changes the frequency of an output in accordance with a control signal output from the loop filter 502. The variable frequency divider 504 divides the frequency of the fundamental wave of an output of the voltage-controlled oscillator 503.

In the case of the PLL frequency synthesizer such as shown in FIG. 5, when the cut-off frequency of the loop filter 502 is raised, the frequency switch time of the output of the voltage-controlled oscillator 501 is shortened.

In order to suppress a reference leakage which is a phenomenon that a reference signal leaks into an external output, or for some purposes, it is necessary to set a cut-off frequency of the loop filter to be lower than the frequency of the reference signal. On the other hand, the frequency interval of the external output depends on a system which uses the PLL frequency synthesizer. In the PLL frequency synthesizer having the configuration as shown in FIG. 5, therefore, the frequency of the reference signal also is determined. Accordingly, there exists a limitation in an increase of the speed of the PLL frequency synthesizer.

SUMMARY OF THE INVENTION

The invention has been conducted in view of the above-mentioned problems of a PLL frequency synthesizer of the prior art. It is an object of the invention to provide a high-speed PLL frequency synthesizer in which the frequency of a reference signal can be made larger than a frequency interval of an external output by a simple configuration.

In order to solve the above-mentioned problem, the PLL frequency synthesizer of the invention has a configuration in which an n-th harmonic of an output of a voltage-controlled oscillator is fed back. With this configuration, the frequency of a reference signal is n times a frequency interval of an external output which is the fundamental wave of the voltage-controlled oscillator. Thus, also an upper limit of a cut-off frequency of a loop filter is raised by a corresponding amount. As a result, it is possible to shorten a frequency switch time as compared with the prior art.

DESCRIPTION OF THE PREFERRED EMBODIMENTS

Hereinafter embodiments of the invention will be described with reference to the accompanying drawings.

Figure 1:
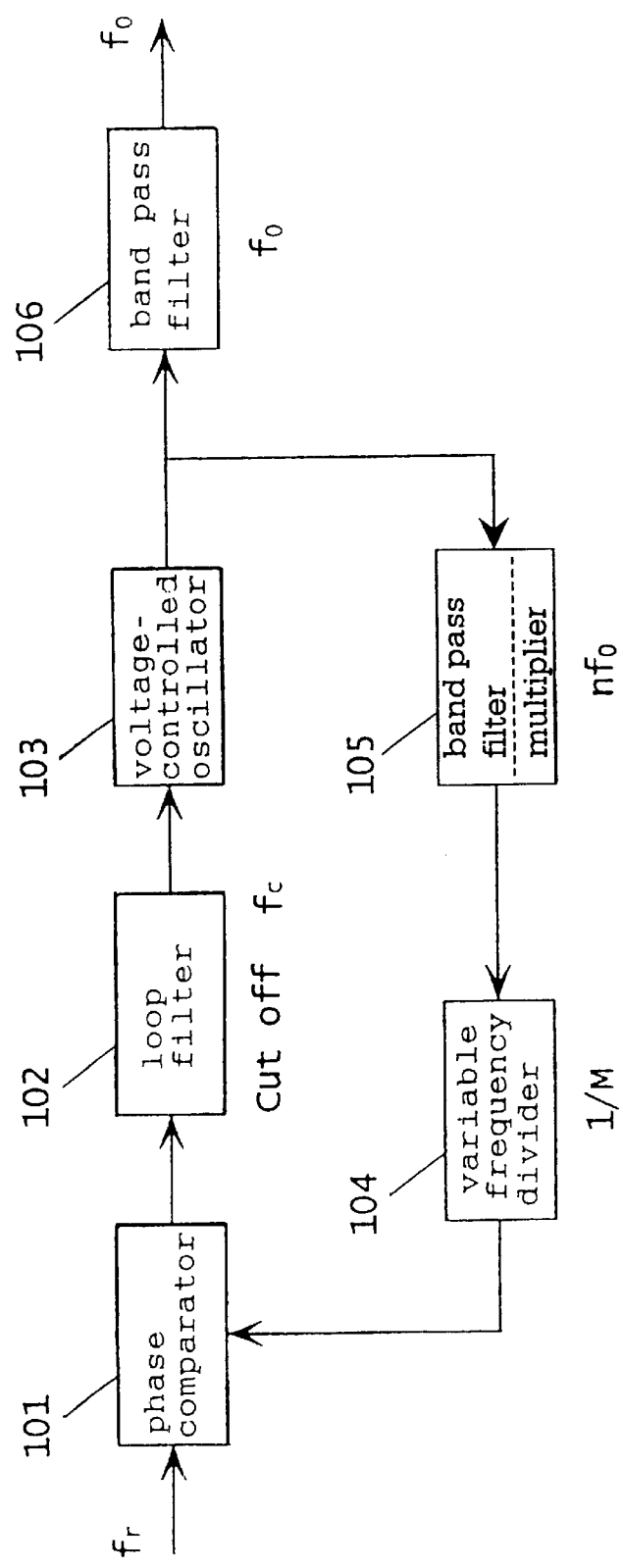
FIG. 1 is a block diagram showing the configuration of Embodiment 1 of the invention.

FIG. 1 shows the configuration of a PLL frequency synthesizer which is Embodiment 1 of the invention. In FIG. 1, 101 designates a phase comparator, 102 designates a loop filter, 103 designates a voltage-controlled oscillator, 104 designates a variable frequency divider, and 105 and 106 designate band pass filters.

The band pass filter 105 allows an n-th harmonic of an output of the voltage-controlled oscillator 103 to pass therethrough. The frequency of an output of the band pass filter 105 is divided by M in the variable frequency divider 104. When the frequency of the fundamental wave of the output of the voltage-controlled oscillator 103 is indicated by fo, the frequency of the n-th harmonic is expressed by nfo, and the frequency of an output of the variable frequency divider is expressed by nfo/M. A signal having the frequency of nfo/M is input into the phase comparator 101. The phase comparator 101 compares the phase of the output of the variable frequency divider 104 with that of a reference signal. The output of the phase comparator 101 is smoothed by the loop filter 102. The output of the voltage-controlled oscillator 103 is controlled by the output of the loop filter 102. The band pass filter 106 allows the fundamental wave of the output of the voltage-controlled oscillator 103 to pass therethrough, so that the fundamental wave is output to the outside. When the frequency of the reference signal is indicated by fr and the frequency of the external output which is the fundamental wave of the output of the voltage-controlled oscillator 103 is indicated by fo, the signals have the following relationship:

$$fo=(M/n) \cdot fr \qquad \text{[Ex. 1]}$$

At this time, when the frequency interval of fo in the case where the frequency division ratio M is varied is indicated by $\Delta f$, the frequency fr is expressed as follows:

$$fr = n \cdot \Delta f \qquad \text{[Ex. 2]}$$

The cut-off frequency fc of the loop filter must be lower than fr. In the prior art example, the frequency fr is limited up to Δf. Therefore in the embodiment, it is possible to increase the limit of the frequency fr to n·Δf.

As described above, the frequency of the reference signal of the PLL frequency synthesizer of the embodiment is n times the frequency interval of the external output which is the fundamental wave of the voltage-controlled oscillator 103. Therefore, it is possible to use a loop filter having a cut-off frequency which is higher by a corresponding amount. Accordingly, the frequency switch time is shortened. That is, the speed of the PLL frequency synthesizer can be increased.

In a PLL frequency synthesizer, a spurious phenomenon occurs at a frequency which is separated from the frequency of the output signal by the frequency interval of the output signal, and at frequencies which are separated from the frequency of the output signal by an integer multiple of the frequency. When the configuration of the embodiment is employed, a spurious phenomenon occurs at a frequency which is separated from the frequency of the output signal by n times of the frequency interval of the output signal, and at frequencies which are separated from the frequency of the output signal by an integer multiple of the frequency. Accordingly, with respect to the frequency of the external output, spurious components are generated at a frequency which is farther separated than a frequency in the case of the prior art, so that the spurious phenomenon can be easily reduced by the loop filter.

In the configuration of FIG. 1, in place of the band pass filter 105, a high-pass filter which allows an n-th harmonic of the output of the voltage-controlled oscillator 103 to pass therethrough, or an amplifier 105' which selectively amplifies an n-th harmonic of the output of the voltage-controlled oscillator 103 may be used. In place of the band pass filter 106, a low-pass filter which allows the fundamental wave of the output of the voltage-controlled oscillator 103 to pass therethrough, or an amplifier which selectively amplifies the fundamental wave of the output of the voltage-controlled oscillator 103 may be used.

Figure 2:
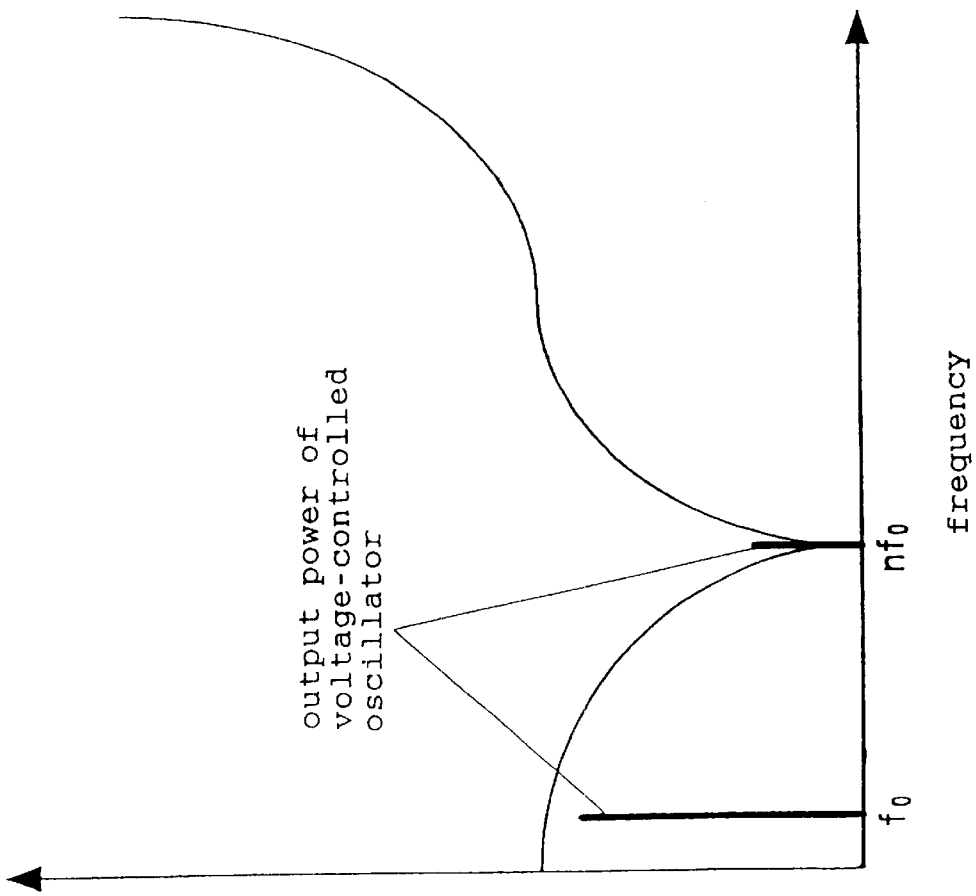
FIG. 2 is a diagram showing relationships between the frequency and the lowest input power at which the frequency division is enabled, in a variable frequency divider.

Instead of the disposition of the band pass filter 105, the lowest input power at which the frequency division is enabled in the input power characteristics of the variable frequency divider 104 may be set as shown in FIG. 2. In this case, at the frequency of the fundamental wave of the output of the voltage-controlled oscillator 103, the lowest input power at which the frequency division is enabled in the variable frequency divider 104 is larger than the output power of the voltage-controlled oscillator 103, and, at a frequency of an n-th harmonic of the output of the voltage-controlled oscillator 103, smaller than that of the voltage-controlled oscillator 103. Accordingly, the variable frequency divider 104 operates for an n-th harmonic of the output of the voltage-controlled oscillator 103, and does not operate for the fundamental wave of the output of the voltage-controlled oscillator 103.

Figure 3:
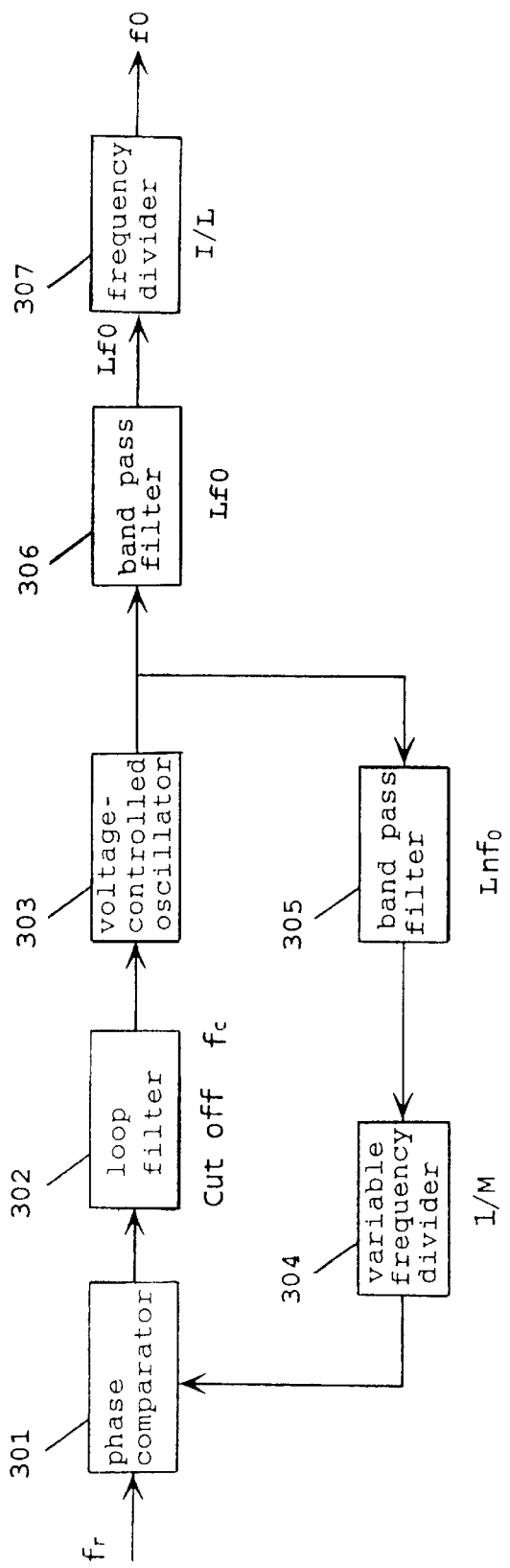
FIG. 3 is a diagram showing the configuration for dividing the frequency of an output of the PLL frequency synthesizer in Embodiment 1 of the invention, and for outputting the divided frequency.

As shown in FIG. 3 illustrating another example of the embodiment, the frequency of an output of a voltage-controlled oscillator may be divided and then output to the outside. In FIG. 3, 301 designates a phase comparator, 302 designates a loop filter, 303 designates a voltage-controlled oscillator, 304 designates a variable frequency divider, 305 and 306 designate band pass filters, and 307 designates a frequency divider. Herein, the frequency of the fundamental wave of the output of the voltage-controlled oscillator 303 is indicated by Lfo.

The band pass filter 305 allows an n-th harmonic of the output of the voltage-controlled oscillator 303 to pass therethrough. The frequency of the output of the band pass filter 305 is divided by M in the variable frequency divider 304. The phase of the output of the variable frequency divider 304 is compared with that of a reference signal in the phase comparator 301. The output of the phase comparator 301 is smoothed by the loop filter 302. The output of the voltage-controlled oscillator 303 is controlled by the output of the loop filter 302. The band pass filter 306 allows the fundamental wave of the output of the voltage-controlled oscillator 303 to pass therethrough. The frequency of the output of the band pass filter 306 is divided by L in the frequency divider 307, and then output to the outside. As a result, the frequency fr of the reference signal is multiplied by L, so that the speed of the PLL frequency synthesizer is more increased by a corresponding amount.

Figure 4:
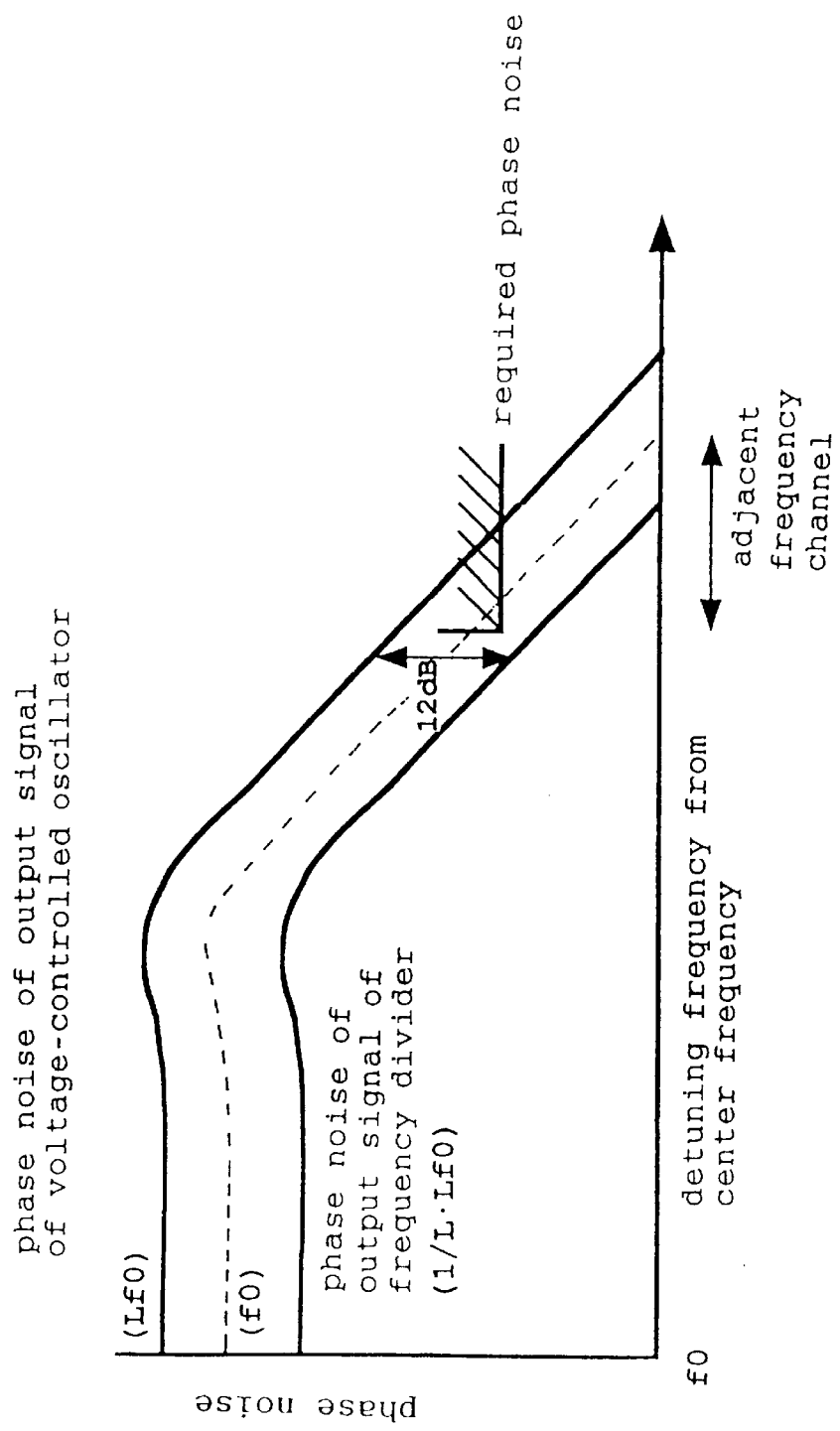
FIG. 4 is a characteristic diagram showing relationships among a phase noise of an output of a voltage-controlled oscillator, a phase noise of an output of a frequency divider, and a phase noise in a desired adjacent channel in the PLL frequency synthesizer of Embodiment 1 of the invention.
Figure 5:
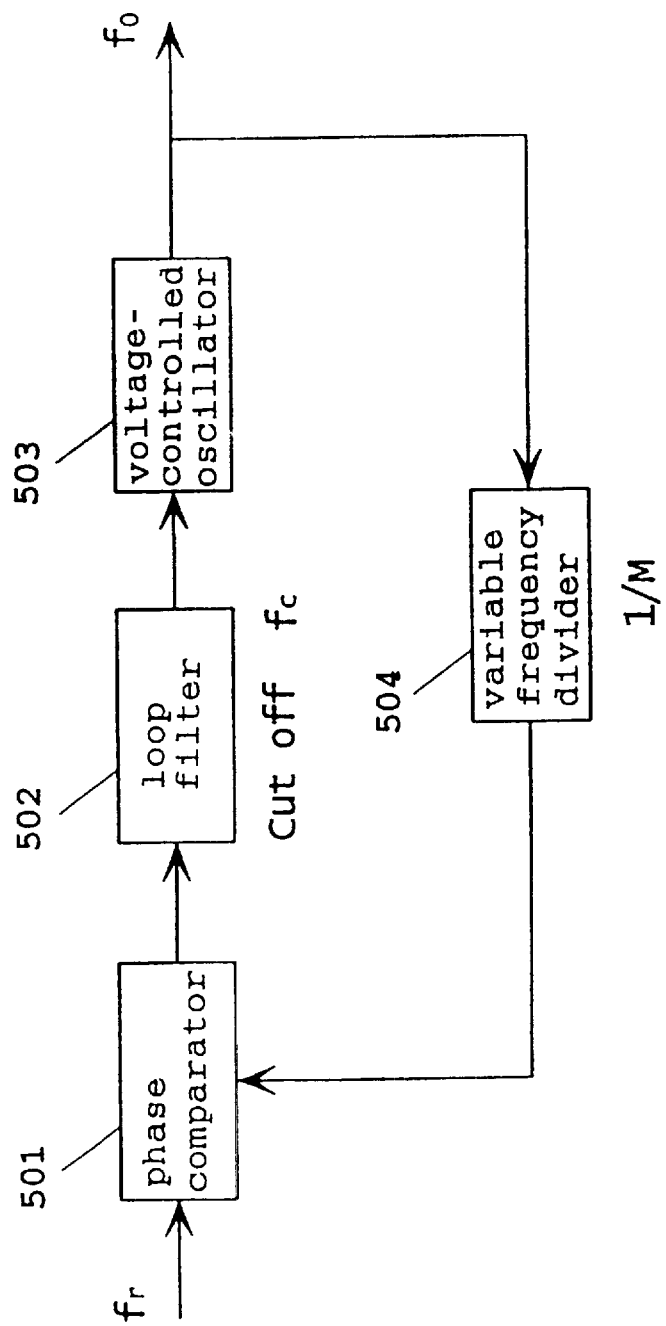
FIG. 5 is a diagram showing an example of the configuration of a PLL frequency synthesizer of the prior art.
Figure 6:
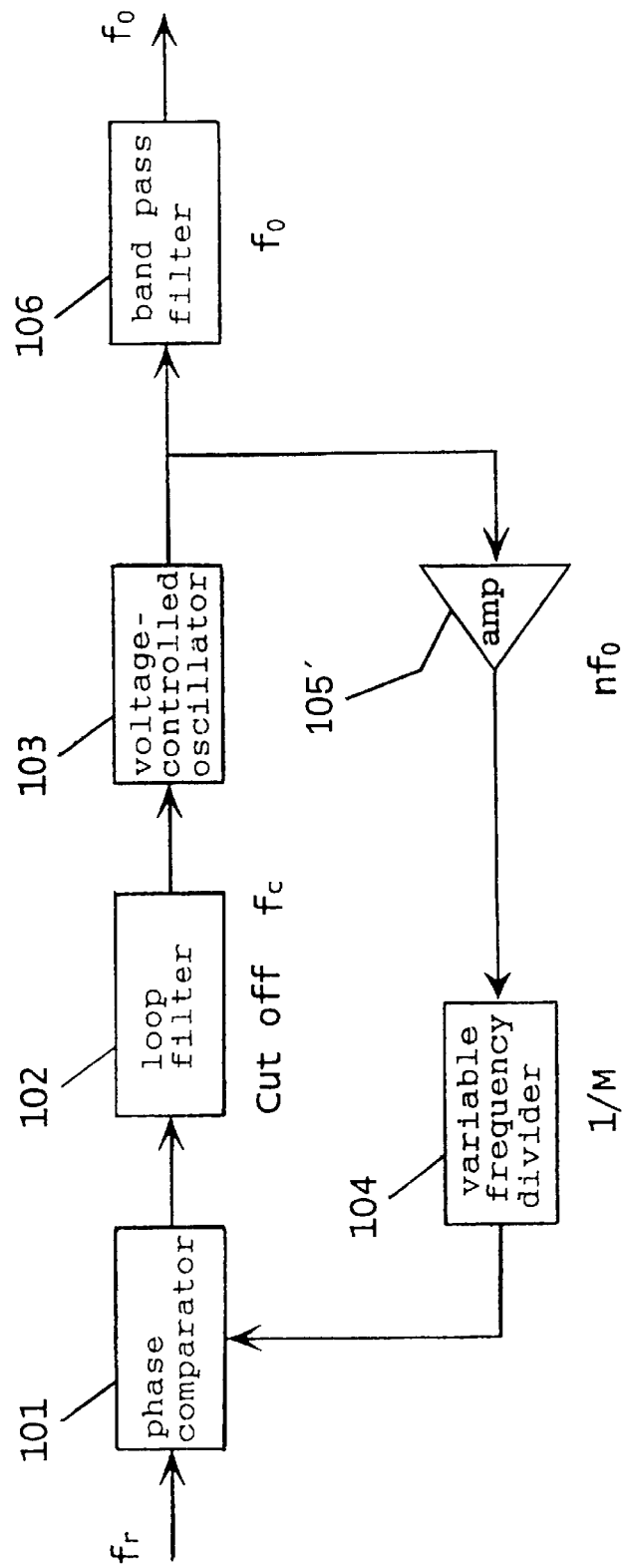
FIG. 6. is a block diagram, similar to FIG. 1, showing an alternative embodiment of the invention.

In addition, the configuration of FIG. 3 can reduce a phase noise. FIG. 4 shows a phase noise of an output signal of the voltage-controlled oscillator 303, a phase noise of an output signal of the frequency divider 307, and limit of a phase noise in a desired adjacent channel, in the case where the frequency of the fundamental wave is Lfo. A phase noise in the case where the frequency of the fundamental wave of the output of the voltage-controlled oscillator is fo is depicted by a broken line. FIG. 4 shows a case where the division ratio of the frequency divider is 4. As a result of the frequency division, the phase noise is reduced by about 12 dB. Accordingly, the phase noise in an adjacent channel in the external output is made lower than a desired limit value. Accordingly, the separation characteristics between adjacent channels are enhanced.

In the embodiment, an n-th harmonic of the output of the voltage-controlled oscillator is utilized in the feedback loop, and the frequency of the reference signal is set to be larger than the frequency interval of the external output, whereby the speed of the frequency switch in the PLL frequency synthesizer is increased. Instead of this configuration, a configuration may be employed in which an input signal to the variable frequency divider is supplied from a multiplier which multiplies the fundamental wave of the output of the voltage-controlled oscillator by n. In such a case, a signal which is multiplied by n in the multiplier is input to the variable frequency divider, and the variable frequency divider operates in the same way as in the case where an n-th harmonic is used in the above-mentioned embodiment. Accordingly, the frequency of the reference signal can be made larger than the frequency interval of the external output. In this case, the circuit is somewhat complicated because the multiplier is disposed, but the speed of the PLL frequency synthesizer can be increased.

As described above, according to the invention, because of the frequency division of an n-th harmonic of the voltage-controlled oscillator and the feedback thereof, the frequency of the reference signal is n times the frequency interval of the external output which is the fundamental wave of the voltage-controlled oscillator. Accordingly, it is possible to increase the band width of the loop filter with a simple configuration. As a result, the frequency switch time of the PLL frequency synthesizer is shortened, and hence remarkable effects can be attained.

What is claimed is:

1. A PLL frequency synthesizer comprising:
   a voltage-controlled oscillator providing a fundamental wave component and harmonics thereof at an output, said voltage controlled oscillator being controlled by a control signal;
   an external output, connected with an output of the voltage-controlled oscillator, said external output providing an output signal as the output of said synthesizer wherein an n-th harmonic component of the output signal has a smaller power than that of the fundamental wave component of said voltage-controlled oscillator;

a variable frequency divider which divides an n-th harmonic of said output of said voltage-controlled oscillator;

a phase comparator which compares a phase of a reference signal with a phase of an output of said variable frequency divider; and a loop filter which smooths an output of said phase comparator to output the smoothed output as said control signal for said voltage-controlled oscillator, wherein a frequency of said reference signal is n times a frequency interval of said external output, said synthesizer further comprises an amplifier which selectively amplifies the n-th harmonic of said output of said voltage-controlled oscillator to output the amplified n-th harmonic to said variable frequency divider, said amplifier does not allow the fundamental wave to pass, and said amplifier is connected with said voltage-controlled oscillator and is connected with said variable frequency divider.

2. A PLL frequency synthesizer according to claim 1, wherein said synthesizer further comprises a band pass filter or a low-pass filter which allows said fundamental wave output of said voltage-controlled oscillator to pass therethrough to output said fundamental wave to outside as said external output.

3. A PLL frequency synthesizer according to claim 2, wherein said synthesizer further comprises a frequency divider which divides the frequency of said output of said voltage-controlled oscillator and which outputs the divided frequency to an outside.

4. A PLL frequency synthesizer according to claim 1, wherein said synthesizer further comprises an amplifier which selectively amplifies the fundamental wave of said output of said voltage-controlled oscillator, to output the amplified fundamental wave to an outside.

5. A PLL frequency synthesizer according to claim 4, wherein said synthesizer further comprises a frequency divider which divides the frequency of said output of said voltage-controlled oscillator and which outputs the divided frequency to an outside.

6. A PLL frequency synthesizer according to claim 1, wherein said synthesizer further comprises a frequency divider which divides the frequency of said output of said voltage-controlled oscillator and which outputs the divided frequency to an outside.

7. A PLL frequency synthesizer comprising:

a voltage-controlled oscillator providing a fundamental wave component and harmonics thereof at an output, said voltage controlled oscillator being controlled by a control signal;

an external output connected with said output of said voltage-controlled oscillator, said external output providing an output signal as the output of said synthesizer wherein an n-th harmonic component of the output signal has a smaller power than that of the fundamental wave component of said voltage-controller oscillator;

a variable frequency divider which divides an n-th harmonic of said output of said voltage-controlled oscillator;

a phase comparator which compares a phase of a reference signal with a phase of an output of said variable frequency divider; and a loop filter which smooths an output of said phase comparator to output the smoothed output as said control signal for said voltage-controlled oscillator, wherein a frequency of said reference signal is n times a frequency interval of said external output, and wherein said synthesizer further comprises a band pass filter or a high-pass filter which allows the n-th harmonic of said output of said voltage-controlled oscillator to pass therethrough to apply the n-th harmonic to said variable frequency divider, said band pass or high-pass filter does not allow the fundamental wave to pass, and said band pass or high-pass filter is connected with said voltage-controlled oscillator and is connected with said variable frequency divider.

8. A PLL frequency synthesizer according to claim 7, wherein said synthesizer further comprises an amplifier which selectively amplifies the n-th harmonic of said output of said voltage-controlled oscillator, to output the amplified n-th harmonic to said variable frequency divider.

9. A PLL frequency synthesizer according to claim 8, wherein said synthesizer further comprises a frequency divider which divides the frequency of said output of said voltage-controlled oscillator and which outputs the divided frequency to an outside.

10. A PLL frequency synthesizer according to claim 7, wherein, in said variable frequency divider, a lowest input power at which a frequency division is enabled at a frequency of said n-th harmonic component of said output of said voltage-controlled oscillator is smaller than a lowest input power at which a frequency division is enabled at a frequency of the fundamental wave of said output of said voltage-controlled oscillator.

11. A PLL frequency synthesizer according to claim 7, wherein said synthesizer further comprises a frequency divider which divides the frequency of said output of said voltage-controlled oscillator and which outputs the divided frequency to an outside.

12. A PLL frequency synthesizer comprising:

a voltage-controlled oscillator providing a fundamental wave and harmonics thereof as an output, said voltage controlled oscillator being controlled by a control signal;

an external output that provides said fundamental wave as the output from said synthesizer;

a variable frequency divider which divides an n-th harmonic of said output of said voltage-controlled oscillator;

a phase comparator which compares a phase of a reference signal with a phase of an output of said variable frequency divider; and a loop filter which smooths an output of said phase comparator to output the smoothed output as said control signal for said voltage-controlled oscillator, wherein a frequency of said reference signal is n times a frequency interval of said fundamental wave of said voltage-controlled oscillator, and wherein in said variable frequency divider, a lowest input power at which a frequency division is enabled at a frequency of said n-th harmonic component of said output of said voltage-controlled oscillator is smaller than a lowest input power at which a frequency division is enabled at a frequency of the fundamental wave of said output of said voltage-controlled oscillator.

13. A PLL frequency synthesizer according to claim 12, wherein a power at a frequency of the fundamental wave of said output of said voltage-controlled oscillator which is applied to said variable frequency divider is smaller than a lowest input power at which a frequency division is enabled at a frequency of the fundamental wave of said output of said voltage-controlled oscillator.

14. A PLL frequency synthesizer according to claim 13, wherein said synthesizer further comprises a frequency divider which divides the frequency of said output of said voltage-controlled oscillator and which outputs the divided frequency to an outside.

15. A PLL frequency synthesizer comprising:
- a voltage-controlled oscillator providing a fundamental wave component and harmonics thereof at an output, said voltage-controlled oscillator being controlled by a control signal;
- an external output connected with an output of the voltage-controlled oscillator, said external output providing an output signal as the output of said synthesizer wherein an n-th harmonic component of the output signal has a smaller power than that of the fundamental wave component of said voltage-controlled oscillator;
- a multiplier which multiplies said fundamental wave output of said voltage-controlled oscillator by n, said multiplier being connected with said voltage-controlled oscillator;
- a variable frequency divider which divides a frequency of said output from said multiplier, said variable frequency divider being connected with said multiplier;
- a phase comparator which compares a phase of a reference signal with a phase of an output of said variable frequency divider; and
- a loop filter which smooths an output of said phase comparator to output the smoothed output as said control signal for said voltage-controlled oscillator, wherein
- a frequency of said reference signal is n times a frequency interval of said external output.

16. A PLL frequency synthesizer according to claim 12, wherein said synthesizer further comprises a frequency divider which divides the frequency of said output of said voltage-controlled oscillator and which outputs the divided frequency to an outside.

* * * * *